(12) United States Patent
Willemen et al.

(10) Patent No.: US 9,263,619 B2
(45) Date of Patent: Feb. 16, 2016

(54) SEMICONDUCTOR COMPONENT AND METHOD OF TRIGGERING AVALANCHE BREAKDOWN

(71) Applicant: Infineon Technologies AG, Neubiberg (DE)

(72) Inventors: Joost Willemen, Munich (DE); Michael Mayerhofer, Taufkirchen (DE); Ulrich Glaser, Putzbrunn (DE); Yiqun Cao, Munich (DE); Andreas Meiser, Sauerlach (DE); Magnus-Maria Hell, Munich (DE); Matthias Stecher, Munich (DE); Julien Lebon, Munich (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 14/020,391

(22) Filed: Sep. 6, 2013

(65) Prior Publication Data

US 2015/0069424 A1 Mar. 12, 2015

(51) Int. Cl.
*H01L 27/15* (2006.01)
*H01L 31/173* (2006.01)
*H01L 27/02* (2006.01)

(52) U.S. Cl.
CPC .......... *H01L 31/173* (2013.01); *H01L 27/0255* (2013.01)

(58) Field of Classification Search
CPC ..................................................... H01L 31/173
USPC ............................................................ 257/84
See application file for complete search history.

(56) References Cited

U.S. PATENT DOCUMENTS

2004/0016992 A1* 1/2004 Mallikarjunaswamy ..... 257/546
2010/0259857 A1* 10/2010 Mayerhofer et al. ........... 361/56

* cited by examiner

*Primary Examiner* — Ajay K Arora
(74) *Attorney, Agent, or Firm* — Murphy, Bilak & Homiller, PLLC (57) ABSTRACT

A semiconductor component includes an auxiliary semiconductor device configured to emit radiation. The semiconductor component further includes a semiconductor device. An electrical coupling and an optical coupling between the auxiliary semiconductor device and the semiconductor device are configured to trigger emission of radiation by the auxiliary semiconductor device and to trigger avalanche breakdown in the semiconductor device by absorption of the radiation in the semiconductor device. The semiconductor device includes a pn junction between a first layer of a first conductivity type buried below a surface of a semiconductor body and a doped semiconductor region of a second conductivity type disposed between the surface and the first layer.

14 Claims, 7 Drawing Sheets

FIG 9 providing an electrical coupling and an optical coupling between an auxiliary semiconductor device configured to emit radiation and a semiconductor device including a pn junction between a first layer of a first conductivity type buried below a surface of a semiconductor body and a doped semiconductor region of a second conductivity type disposed between the surface and the first layer — S900 the electrical and optical coupling includes triggering emission of radiation by the auxiliary semiconductor device and triggering avalanche breakdown in the semiconductor device by absorption of the radiation in the semiconductor device — S910

SEMICONDUCTOR COMPONENT AND METHOD OF TRIGGERING AVALANCHE BREAKDOWN

BACKGROUND

Semiconductor components including semiconductor devices operating in avalanche breakdown mode are widespread in semiconductor applications. By way of example, avalanche breakdown typically initiates current consumption in electrostatic discharge (ESD) devices for protecting circuit blocks from damage by electrostatic discharge during assembly or operation.

It is desirable to provide a semiconductor component having fast and reliable turn-on of avalanche breakdown and to provide a method of triggering avalanche breakdown in a semiconductor device.

SUMMARY

According to an embodiment of a semiconductor component, the semiconductor component includes an auxiliary semiconductor device configured to emit radiation. The semiconductor component further includes a semiconductor device. An electrical coupling and an optical coupling between the auxiliary semiconductor device and the semiconductor device are configured to trigger emission of radiation by the auxiliary semiconductor device and to trigger avalanche breakdown in the semiconductor device by absorption of the radiation in the semiconductor device. The semiconductor device includes a pn junction between a first layer of a first conductivity type buried below a surface of a semiconductor body and a doped semiconductor region of a second conductivity type disposed between the surface and the first layer.

According to a method of triggering avalanche breakdown in a semiconductor device, the method includes providing an electrical coupling and an optical coupling between an auxiliary semiconductor device configured to emit radiation and the semiconductor device including a pn junction between a first layer of a first conductivity type buried below a surface of a semiconductor body and a doped semiconductor region of a second conductivity type disposed between the surface and the first layer. The electrical and optical coupling include triggering emission of radiation in the auxiliary semiconductor device and triggering avalanche breakdown in the semiconductor device by absorption of the radiation in the semiconductor device Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise. The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
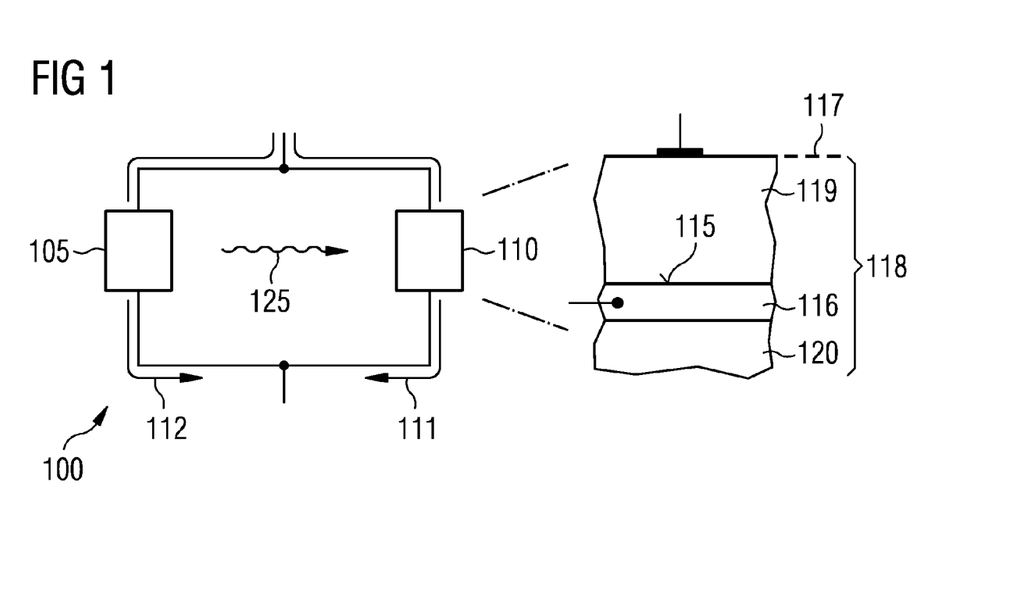
FIG. 1 schematically illustrates one embodiment of a semiconductor component including an auxiliary semiconductor device configured to emit radiation and a semiconductor device.

FIG. 1 is a schematic illustration of one embodiment of a semiconductor component 100 including an auxiliary semiconductor device 105 configured to emit radiation 125 and a semiconductor device 110. The semiconductor device 110 includes a pn junction 115 between a first layer 116 of a first conductivity type buried below a surface 117 of a semiconductor body 118. The semiconductor device 110 further includes a doped semiconductor region 119 of a second conductivity type disposed between the surface 117 and the first layer 116. According to the embodiment illustrated in FIG. 1, the first layer 116 is disposed between the doped semiconductor region 119 and a semiconductor substrate 120.

An electrical coupling and an optical coupling between the auxiliary semiconductor device 105 and the semiconductor device 110 are configured to trigger emission of the radiation 125 by the auxiliary semiconductor device 105 and to trigger avalanche breakdown in the semiconductor device 110 by absorption of the radiation 125 in the semiconductor device 110.

According to an embodiment, the auxiliary semiconductor device 105 and the semiconductor device 110 are electrically coupled in parallel. A first breakdown voltage Vbr1 along a first current path 111 through the semiconductor device 110 may be larger than a second breakdown voltage Vbr2 along a second current path 112 through the auxiliary semiconductor device 105. Hence, at least a part of the current flowing through the auxiliary semiconductor device 105 can be converted into the radiation 125. According to another embodiment, the first breakdown voltage Vbr1 along the first current path 111 through the semiconductor device 110 may be equal to or smaller than the second breakdown voltage Vbr2 along the second current path 112 through the auxiliary semiconductor device 105. In this embodiment, the radiation 125 emitted by the auxiliary semiconductor device 105 may still trigger avalanche breakdown in the semiconductor device 110, e.g. within a voltage margin of an ESD design window.

Emission of the radiation 125 by the auxiliary semiconductor device 105 may be due to carrier recombination in a forward biased bipolar junction and/or carrier acceleration in an electric field which takes place e.g. during avalanche breakdown under reverse bias conditions. In case of a forward biased silicon bipolar junction, a luminescence spectrum may include a narrow peak around 1160 nm wavelength with a full width at half maximum (FWHM) of 70 nm to 120 nm. Thus, a peak energy of the emitted photons (hv=1.07 eV) is slightly below the bandgap energy of silicon ($E_g$=1.12 eV). In case of a reverse biased silicon bipolar junction having a broader luminescence spectrum than in case of forward biased silicon bipolar junctions, reported peak wavelengths widely vary between values of 500 nm and above 1200 nm (infrared light).

The radiation 125 emitted by the auxiliary semiconductor device 105 is at least partly absorbed in the semiconductor device 110. The radiation 125 absorbed in the semiconductor device 110 generates at least one single charge carrier that is accelerated in the electric field of a space charge region of the pn-junction 115, thereby triggering avalanche breakdown in the semiconductor device 110. As an example, the charge carrier initiating avalanche breakdown in the pn-junction 115 is due to electron-hole pair generation by absorption of the radiation 125.

Since the semiconductor component 100 includes the auxiliary semiconductor device 105, avalanche breakdown in the semiconductor device 110 can be initiated by a charge carrier generated in the semiconductor device 110 by absorption of the radiation 125. Thereby, a delay of avalanche turn-on due to e.g. a biasing state of an avalanche breakdown device or long voltage overshoot peaks in the avalanche breakdown device can be suppressed or avoided. Avalanche turn-on delay of a semiconductor device describes a delay between applying a breakdown voltage to the semiconductor device and an actual turn-on of the avalanche breakdown including avalanche current flow. By way of example, turn-on behavior of high-voltage electrostatic discharge (ESD) protection devices can be improved. The optical coupling between the auxiliary semiconductor device 105 and the semiconductor device 110 secures absorption of the radiation 125 in the semiconductor device 110. By way of example, a distance between the auxiliary semiconductor device 105 and the pn junction 115 may be adjusted depending on the luminescence spectrum of the auxiliary semiconductor device 105 and a corresponding absorption coefficient of the semiconductor body 118. By adding the auxiliary semiconductor device 105 to the semiconductor device 110, faster avalanche generation can be initiated and thus the avalanche delay time in the semiconductor device 110 is decreased. This is due to reabsorption of photons generated by the auxiliary semiconductor device 105 in the space charge region of the pn junction 115 of semiconductor device 110 or within a distance allowing diffusion of a generated minority carrier to the space charge region of the pn junction 115. The reabsorbed photons will provide the avalanche initiating electron-hole pairs. As this takes place on a shorter time scale, the avalanche generation will start faster as in the case where avalanche generation is solely based on thermal carrier generation.

Figure 2:
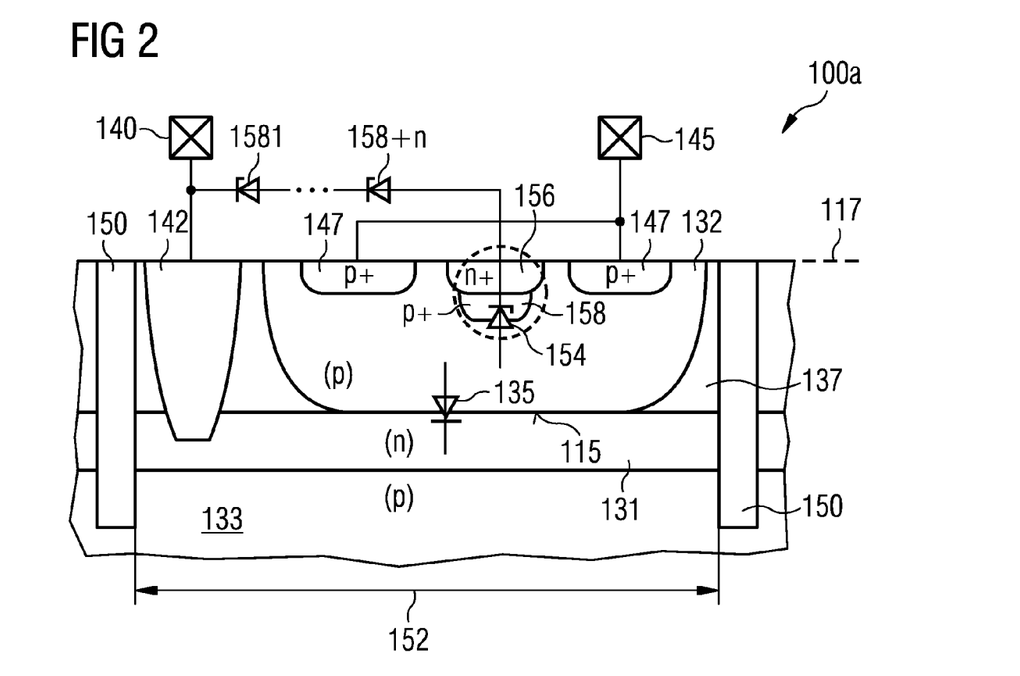
FIGS. 2 to 4 are schematic cross-sectional views of semiconductor components including a semiconductor device having a pn junction between a p-well and an n-buried layer and different layouts of an auxiliary semiconductor device configured to emit radiation.
Figure 3:
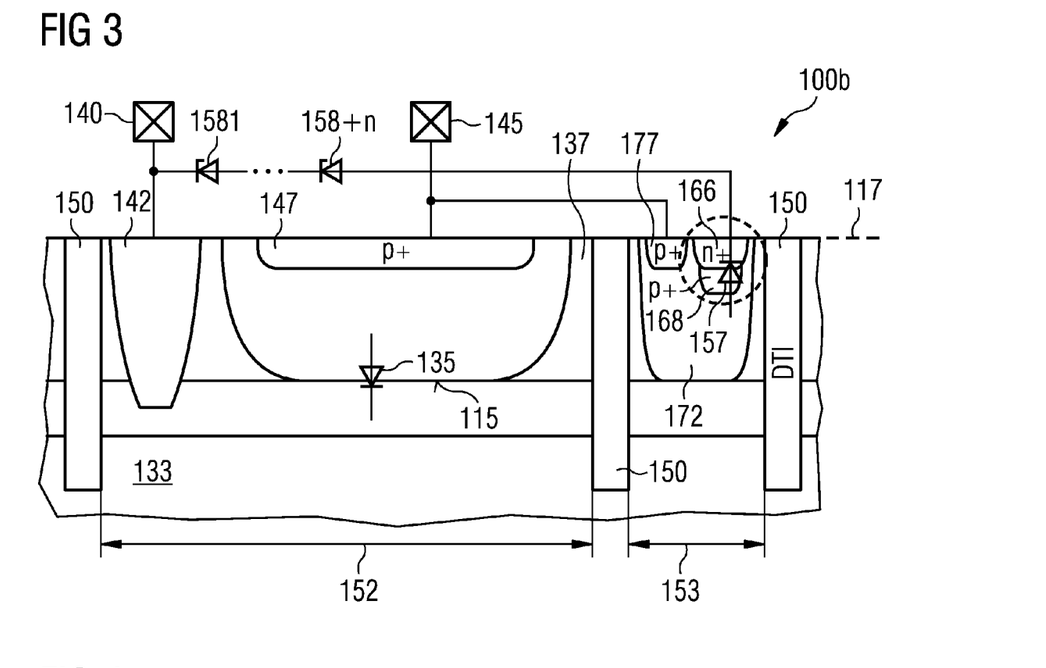
Figure 4:
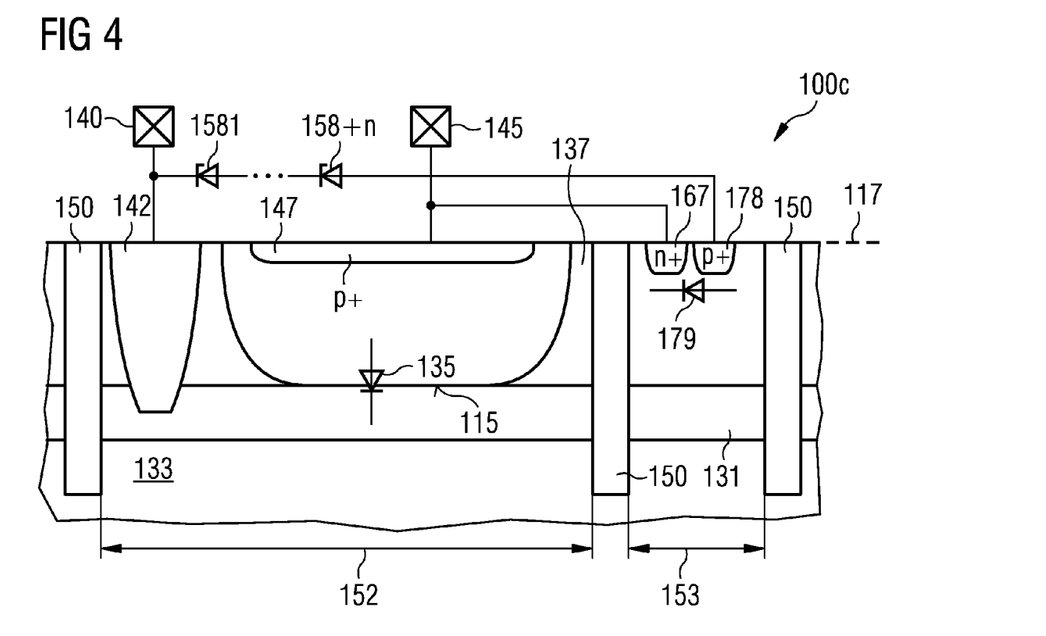

FIGS. 2 to 4 are schematic cross-sectional views of semiconductor components 100a . . . 100c including an ESD diode as a semiconductor device and different layouts of an auxiliary semiconductor device configured to emit radiation. In each of the semiconductor components 100a . . . 100c, the semiconductor device includes the pn junction 115 between an n-doped buried layer 131 and a p-doped semiconductor well region 132 disposed between the surface 117 and the n-doped buried layer 131. The n-doped buried layer 131 is disposed between the p-doped well region 132 and a p-doped semiconductor substrate 133. The p-doped semiconductor substrate 133 may include or consist of single-crystalline semiconductor material, for example silicon (Si), silicon carbide (SiC), germanium (Ge), silicon germanium (SiGe), gallium nitride (GaN) or gallium arsenide (GaAs). Apart from a junction isolation between a semiconductor layer and a semiconductor substrate, e.g. an n-doped layer on a p-doped substrate, also vertical dielectric isolation may be applied by using a silicon-on-insulator (SOI) substrate.

The semiconductor device of the semiconductor component 100a is an ESD diode 135 illustrated by a diode symbol in FIG. 2. The ESD diode 135 is a vertical ESD diode having the pn junction 115 in a plane buried below the surface 117. The n-doped buried layer 131 is electrically coupled to a cathode pin 140 at the surface 117 via an n-doped sinker 142 extending from the surface 117 along a vertical direction perpendicular to the surface 117 into the n-doped buried layer 131. The n-doped sinker 142 is one example of a contact structure electrically coupling the n-doped buried layer 131 to the cathode pin 140. According to other embodiments, the n-doped sinker 142 may be replaced by a trench contact structure, a mesa contact and/or a metal contact directly contacting the n-doped buried layer 131.

The p-doped well region 132 is electrically coupled to an anode pin 145 via the surface 117. A p$^+$-doped contact region 147 is disposed in the p-doped well region 132 at the surface 117 for lowering a contact resistance between the p-doped well region 132 and a wiring to the anode pin 145. The n-doped sinker 142 and the p-doped well region 132 may be formed by doping a semiconductor layer 137 on the p-doped semiconductor substrate 133, e.g. by doping techniques such as ion implantation and/or diffusion. By way of example, the n-doped sinker 142 may be formed by in-situ doping during layer deposition and/or by ion implantation prior to or in-between deposition or growth of the semiconductor layer 137.

The ESD diode 135 is electrically isolated from semiconductor devices surrounding the ESD diode 135 by a deep trench isolation structure 150. The deep trench isolation structure 150 extends from the surface 117 through the semiconductor layer 137 and through the n-doped buried layer 131, and into the p-doped semiconductor substrate 133. The deep trench isolation structure 150 includes dielectric material such as oxide and/or nitride in a deep trench, for example. The deep trench isolation structure 150 is one example of electrical isolation between neighboring semiconductor devices. According to other embodiments, the deep trench isolation structure 150 may be replaced by a junction isolation structure or any other structure configured to electrically isolate neighboring semiconductor devices. Within the deep trench isolation structure 150, a contact to the p-doped substrate 133 may be provided.

The ESD diode 135 is formed in an active area 152 being a continuous semiconductor region between opposite deep trench isolation structures 150. In the embodiment illustrated in FIG. 2, the semiconductor component 100a includes the auxiliary semiconductor device configured to emit radiation within the active area 152 of the ESD diode 135. In other words, the ESD diode 135 and the auxiliary device configured to emit radiation are not electrically isolated from each other by the deep trench isolation structure 150.

In the embodiment illustrated in FIG. 2, the auxiliary device configured to emit radiation is a Zener diode 154 electrically coupled between the cathode pin 140 and the anode pin 145. The Zener diode 154 includes an $n^+$-doped cathode region 156 in the p-doped well region 132. The $n^+$-doped cathode region 156 adjoins the surface 117 and is electrically coupled to the cathode pin 140. Depending on maximum voltage ratings of the cathode pin 140, a number n of additional voltage blocking elements such as Zener diodes 158₁ . . . 158+n or forward biased diodes may be electrically connected between the cathode pin 140 and the Zener diode 154. The Zener diode 154 further includes a $p^+$-doped anode region 158 buried below the surface 117. The p+-doped anode region 158 adjoins a bottom side of the $n^+$-doped cathode region 156 and is further surrounded by the p-doped well region 132. The $p^+$-doped anode region 158 is electrically coupled to the anode pin 145 via the p-doped well region 132 and the $p^+$-doped contact regions 147 of the ESD diode 135.

In the embodiment illustrated in FIG. 2 the ESD diode 135 and the Zener diode 154 share one common active area 152. Thus, optical coupling between the Zener diode 154 acting as the semiconductor device configured to emit radiation and the ESD diode 135 acting as the semiconductor device is beneficial since photons emitted from the Zener diode 154 can be absorbed nearby in the space charge region of the pn junction 115 of the ESD diode 135, thereby triggering avalanche breakdown in the ESD diode 135.

According to an embodiment, a first breakdown voltage Vbr1 of a first current path between the cathode pin 140 and the anode pin 145 through the ESD diode 135 is larger than a second breakdown voltage Vbr2 of a second current path between the cathode pin 140 and the anode pin 145 through the Zener diode 154. Setting Vbr2<Vbr1 may be achieved by adjusting doping profiles of the pn junction 115 as well as by adjusting the number n and/or the type of voltage blocking elements between the Zener diode 154 and the cathode pin 140, for example. In case of an ESD discharge between the cathode pin 140 and the anode pin 145, emission of radiation by the Zener diode 154 generates photons that are available for absorption in the space charge region of the pn junction 115, thereby initiating avalanche breakdown in the ESD diode 135. Such photons may still trigger avalanche breakdown in the semiconductor device 110 in case that Vbr2>=Vbr1 holds, e.g. when triggering of avalanche breakdown in the semiconductor device 110 occurs within a voltage margin of an ESD design window.

Referring to the schematic cross-sectional view of FIG. 3, a semiconductor component 100b includes the ESD diode 135 as a semiconductor device having a similar layout to the semiconductor device illustrated in FIG. 2.

The semiconductor component 100b further includes a Zener diode 157 electrically isolated from the ESD diode 135 by the trench isolation structure 150. Optical coupling between the radiation generated in the Zener diode 157 and the ESD diode 135 is secured by separating the active area 152 of the ESD diode 135 and an active area 153 of the Zener diode 157 by merely one trench isolation structure 150. In other words, the ESD diode 135 and the Zener diode 157 are placed directly next to each other. Photons emitted from the Zener diode 157 can be absorbed in the space charge region of the pn junction 115 of the ESD diode 135 for initiating avalanche generation in the ESD diode 135. Similar to the Zener diode 154 illustrated in FIG. 2, the Zener diode 157 includes an $n^+$-doped cathode region 166 adjoining the surface 117. The $n^+$-doped cathode region 166 is electrically coupled to the cathode pin 140. The Zener diode 157 further includes a $p^+$-doped anode region 168 adjoining a bottom side of the $n^+$-doped cathode region 166. The $p^+$-doped anode region 168 is further surrounded by a second p-doped well region 172. A second $p^+$-doped contact region 177 is formed for lowering a contact resistance between the second p-doped well region 172 and a wiring to the anode pin 145. Intervening voltage blocking elements such as Zener diode 158₁ . . . 158+n may be provided.

Referring to the schematic cross-sectional view illustrated in FIG. 4, a semiconductor component 100c includes the ESD diode 135 as a semiconductor device having a similar layout to the semiconductor device illustrated in FIG. 2.

The semiconductor component 100c further includes a diode 179 electrically isolated from the ESD diode 135 by the trench isolation structure 150. Optical coupling between radiation generated in the diode 179 and the ESD diode 135 is secured by separating the active area 152 of the ESD diode 135 and an active area 153 of the diode 179 by merely one trench isolation structure 150. In other words, the ESD diode 135 and the diode 179 are placed directly next to each other. Photons emitted from the diode 179 can be absorbed in the space charge region of the pn junction 115 of the ESD diode 135 for initiating avalanche generation in the ESD diode 135.

Whereas generation of photons in the Zener diodes 154, 157 is caused by a breakdown mode of the Zener diodes 154, 157, generation of photons in the diode 179 is caused by a forward biased mode of the diode 179. Thus, the diode 179 includes a $p^+$-doped anode region 178 electrically coupled to the cathode pin 140. An $n^+$-doped cathode region 167 of the diode 179 is electrically coupled to the anode pin 145. Intervening voltage blocking elements such as Zener diodes 158₁ . . . 158+n may be placed for adjusting a breakdown voltage Vbr2 of a current path between the cathode pin 140 and the anode pin 145 through the diode 179.

The semiconductor components 100a, 100b, 100c may further include isolation regions, e.g. shallow trench isolation (STI) region(s) and/or field oxide (FOX) regions and/or local oxidation of silicon (LOCOS) region(s), between p-doped and n-doped regions at the surface, e.g. between p+-doped contact regions 147 and the n+-doped cathode region 156 of FIG. 2 or between the second p+-doped contact region 177 and the n+-doped cathode region 166 of FIG. 3 or between the p+-doped anode region 178 and the n+-doped cathode region 167 of FIG. 4.

In the embodiments illustrated in FIGS. 3 and 4, the active area 152 of the ESD diode 135 and the active area 153 of the diodes 157, 179 are separated by merely one trench isolation structure 150. According to other embodiments, the active areas 152, 153 may be separated by more than one trench isolation structure 150 including optional intervening active areas provided that sufficient optical coupling between the ESD diode 135 and the diodes 157, 179 is maintained.

Figure 5:
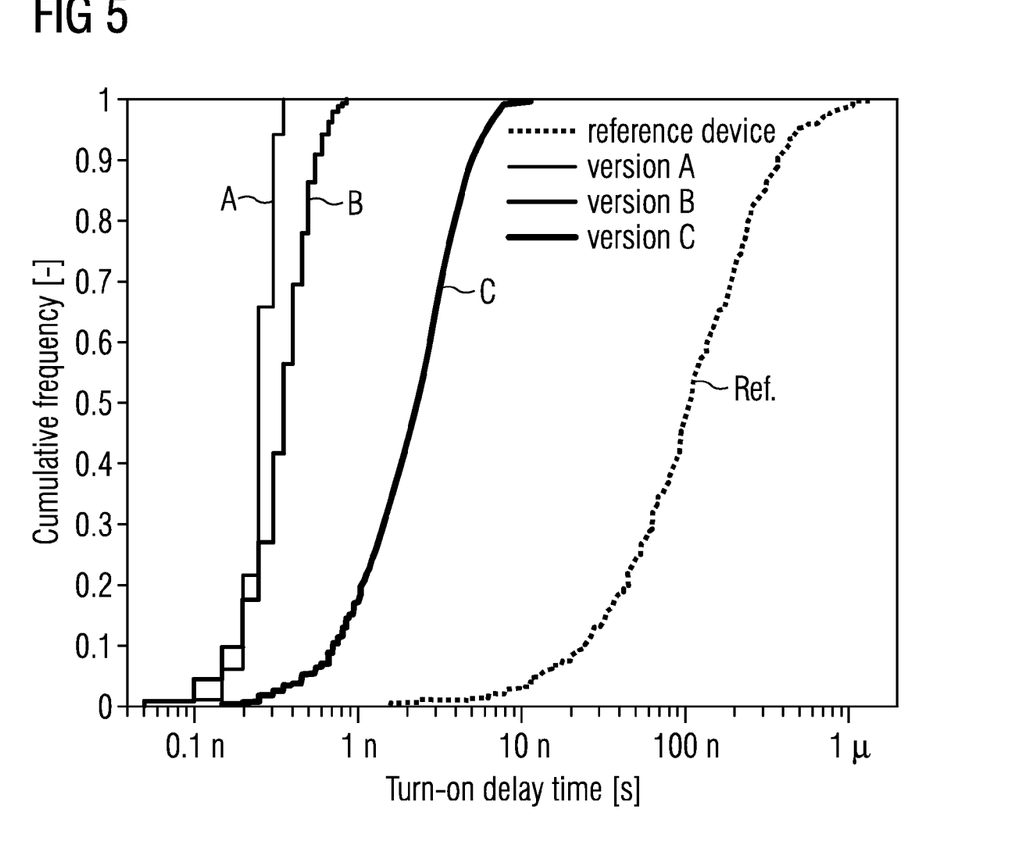
FIG. 5 is a graph illustrating a cumulative frequency of statistically distributed avalanche turn-on delay times for a reference device without an auxiliary device configured to emit radiation and for the embodiments illustrated in FIGS. 2 to 4 and denoted as curve A, curve B and curve C.
Figure 6:
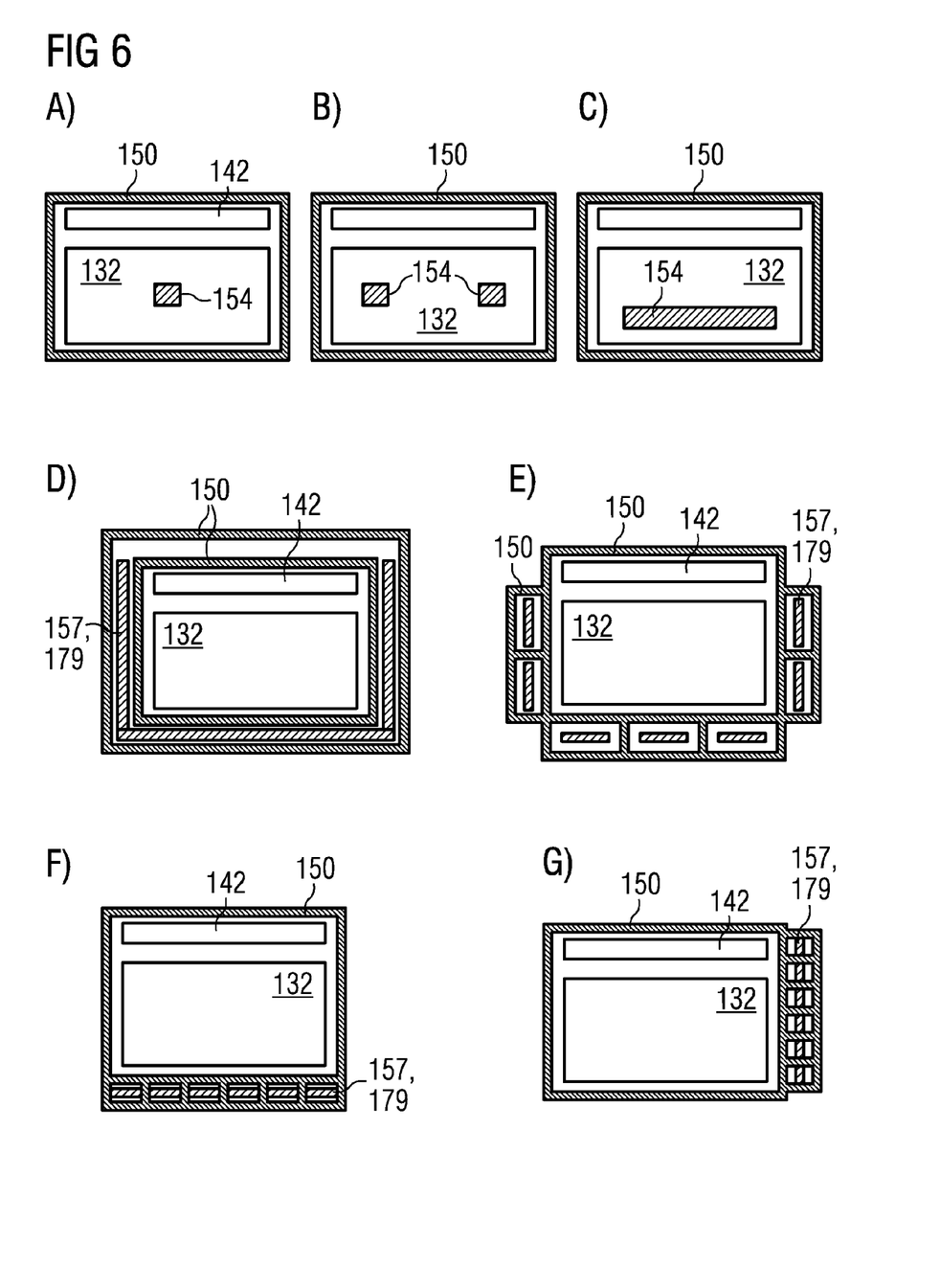
FIGS. 6A to 6J illustrate schematic plan views of different layouts of semiconductor components including a semiconductor device and an auxiliary semiconductor device configured to emit radiation.
Figure 7:
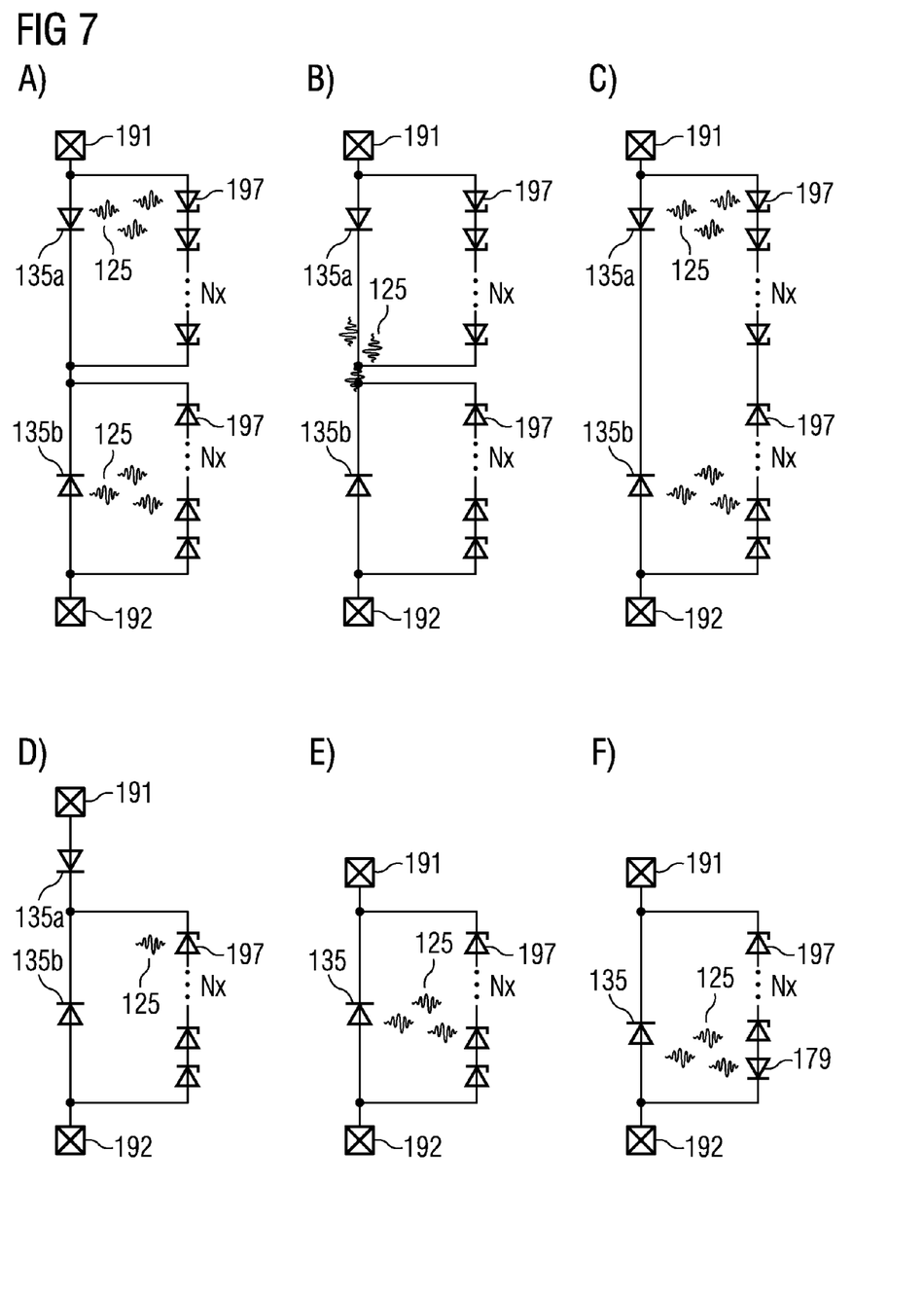
FIGS. 7A to 7F illustrate embodiments of circuit diagrams of semiconductor components including a stack of radiation-triggered anti-serial ESD diodes.

FIG. 5 illustrates a cumulative frequency of statistically distributed avalanche turn-on delay times for a reference device (curve Ref.) without an auxiliary device configured to emit radiation and for semiconductor components according to the embodiments illustrated in FIGS. 2 to 4.

Curve A is related to the semiconductor component 100a illustrated in FIG. 2. Curve B is related to the semiconductor component 100b illustrated in FIG. 3. Curve C is related to the semiconductor component 100c illustrated in FIG. 4. The illustrated curves A, B, C, and Ref. are based on an analysis of a distribution of measured turn-on delay times for respective semiconductor components. Measurement of the turn-on delay times were performed as transmission line pulse (TLP) measurements. The measurements were done with 100 ns to 1500 ns pulses from a 50 ohm TLP system. As the TLP equipment used produces pulses with a shortest rise time of 100 ps, turn-on behavior in sub-ns time scale could be accurately determined. The voltage transients were directly captured at the device under test (DUT) by a Kelvin measurement method, utilizing RF probes with an integrated 5 kΩ resistor in the tip. Non-ideal properties of the probe tips, that overestimate very fast overshoots, were corrected for by a de-embedding procedure. A 12 GHz oscilloscope with 20 G samples/s was use to capture very short overshoot peaks accurately. Pre-bias was applied to the DUT using a RF bias-tee. For analysis of the turn-on behavior the statistical distribution of the turn-on delay time was determined as the FWHM time of voltage overshoot peaks. Distributions were extracted from at least 200 TLP pulses at the same pulse and biased conditions and visualized as cumulative frequency plots in FIG. 5.

Compared to the reference device Ref., curve C associated with the semiconductor component 100c illustrated in FIG. 4 shows a clear reduction of the turn-on delay time, but still a median delay time of approximately 2 ns. The curves A and B associated with the semiconductor components 100a, 100b illustrated in FIGS. 2 and 3, respectively, which employ reverse biased breakdown structures as photon emitters, have much shorter turn-on delay times of less than 1 ns which may be ascribed to a better optical coupling in semiconductor components 100a, 100b (photon generation by Zener breakdown) than in semiconductor component 100c (photon generation by forward biased bipolar junction). Curve A related to the semiconductor component 100a having the photon-emitting Zener diode 154 integrated in the p-doped well region 132 of the ESD diode 135 has the shortest turn-on delay. This may be due to a superior optical coupling between the photon-emitting Zener diode 154 and the photon-absorbing space charge region of the pn junction 115 of the ESD diode 135.

FIGS. 6A to 6J illustrates schematic plan views of different layouts of a semiconductor component including a semiconductor device and an auxiliary semiconductor device configured to emit radiation.

The schematic plan views of FIGS. 6A to 6C illustrate schematic plan views of different layouts of a semiconductor component including the device configured to emit radiation and the semiconductor device in a common active area similar to the semiconductor component 100a illustrated in FIG. 2. The layouts of FIGS. 6A to 6C differ by a number and/or a shape of an area of the Zener diode 154 acting as the auxiliary device configured to emit radiation. The p-doped well region 132 of the ESD diode 135 is similar to the illustration of FIG. 2.

FIGS. 6D to 6G illustrate schematic plan views of semiconductor components including the device configured to emit radiation, e.g. the Zener diode 157 or the diode 179 of the semiconductor components 100b, 100c illustrated in FIGS. 3 and 4 in active area(s) surrounding the active area 152 of the ESD diode and being electrically isolated therefrom by the deep trench isolation structure 150. Elements of the auxiliary semiconductor device configured to emit radiation may thus be placed around or at different sides of the semiconductor device. The auxiliary device(s) configure to emit radiation may also be placed between distinct parts of the semiconductor device which are connected in parallel (c.f. FIG. 6H). Spacings s between the semiconductor device and the auxiliary semiconductor device configured to emit radiation (c.f. FIGS. 6I and 6J) are acceptable as far as sufficient optical coupling between these devices is maintained.

Apart from single ESD diodes between circuit pins to be protected, a stack of anti-serial ESD diodes may be connected between the pins to be protected against ESD. Each one of the stacked diodes may be formed as a semiconductor device similar to the embodiments illustrated in FIGS. 1 to 6.

The ESD diode 135 may include multiple anode regions and/or multiple cathode contact structures such as sinkers. Anode and/or cathode regions at the surface may have rectangular shape, circular shape, mosaic shape, tiled shaped or any combination thereof.

In each of the circuit diagrams illustrated in FIGS. 7A to 7D, a stack of anti-serial ESD diodes 135a, 135b are connected between first and second pins 191, 192 to be protected, e.g. a supply pin and a ground pin. One or several Zener diodes 197 act as the auxiliary device configured to emit the radiation in the embodiments illustrated in FIGS. 7A and 7C. In the embodiment illustrated in FIG. 7B, the ESD diode 135a acts as the photon emitting device for the ESD diode 135b in case of a positive voltage pulse at the pin 191 with respect to the pin 192, whereas the ESD diode 135b acts as the photon emitting device for the ESD diode 135a in case of a negative voltage pulse at the pin 191 with respect to the pin 192. Whether the first scenario as described with respect to FIGS. 7A and 7C or the second scenario described with respect to FIG. 7B applies depends upon the optical coupling between the ESD diodes 135a, 135b and the Zener diodes 197. Even a combination of both scenarios may apply in case of sufficient optical coupling between the ESD diode 135a and 135b as well as sufficient optical coupling between each one of the ESD diodes 135a, 135b and one or more of the Zener diodes 197. In the embodiment illustrated in FIG. 7D, a stack of Zener diodes 197 is electrically coupled in parallel to the ESD diode 135b. In the embodiment illustrated in FIG. 7E, avalanche breakdown in the single ESD diode 135 is triggered by the radiation 125 emitted by the Zener diodes 197 electrically coupled in parallel to the single ESD diode 135. In the embodiment illustrated in FIG. 7F, the Zener diodes 197 and the diode 179 are electrically coupled in parallel to the single ESD diode 135.

Figure 8:
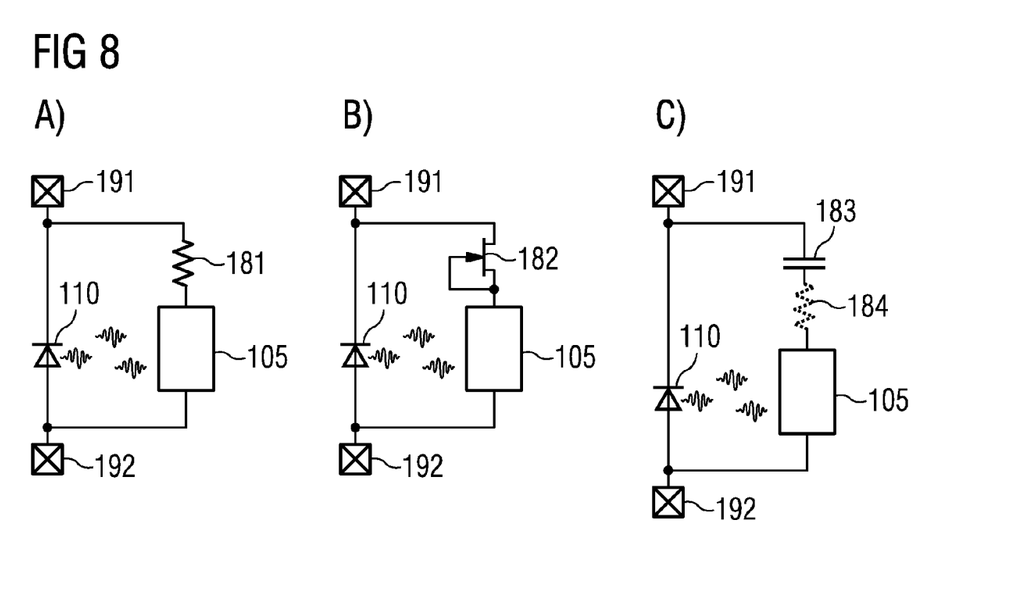
FIGS. 8A to 8C illustrate embodiments of circuit diagrams of semiconductor components including circuit elements electrically connected in series to an auxiliary device configured to emit radiation.

FIGS. 8A to 8C illustrate embodiments of circuit elements electrically connected in series to the auxiliary semiconductor device 105 configured to emit radiation. Whereas a resistor 181 acts as a current limiting element for the auxiliary semiconductor device 105 in the embodiment illustrated in FIG. 8A, a junction field effect transistor (JFET) or a depletion mode field effect transistor (FET) 182 acts as the current limiting element for the auxiliary semiconductor device 105 in the embodiment illustrated in FIG. 8B. A differentiating network including a capacitor 183 and an optional resistor 184 is connected in series to the auxiliary semiconductor device 105 illustrated in FIG. 8C for allowing a substantial current flow through the auxiliary semiconductor device 105 only during a sharp transient voltage. Therefore, DC current flow is suppressed and transient current peaks occur during voltage transients.

Figure 9:
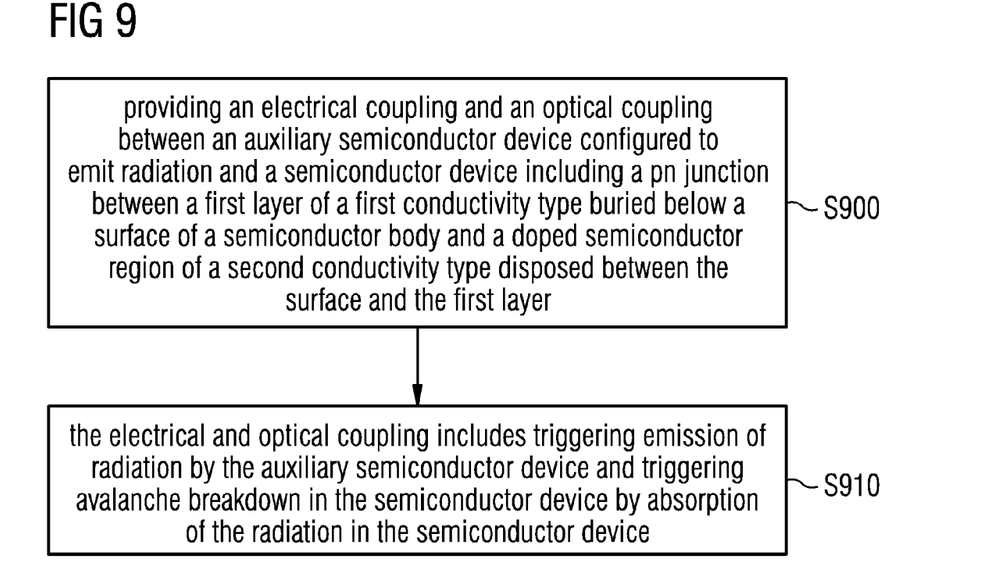
FIG. 9 is a simplified flow chart illustrating a method of triggering avalanche breakdown in a semiconductor device.

FIG. 9 is a simplified flow chart of a method of triggering avalanche breakdown in a semiconductor device. Process feature S900 of the method includes providing an electrical coupling and an optical coupling between an auxiliary semiconductor device configured to emit radiation and a semiconductor device including a pn junction between a first layer of a first conductivity type buried below a surface of a semiconductor body and a doped semiconductor region of a second conductivity type disposed between the surface and the first layer. According to process feature S910 of the method, the electrical and optical coupling includes triggering emission of radiation by the auxiliary semiconductor device and triggering avalanche breakdown in the semiconductor device by absorption of the radiation in the semiconductor device.

According to an embodiment, the method further comprises electrically coupling the auxiliary semiconductor device and the semiconductor device in parallel.

According to another embodiment, a current through the auxiliary device is limited by electrically connecting at least one of a resistor, a junction field effect transistor, and a depletion mode field effect transistor in series to the auxiliary device.

According to another embodiment, the auxiliary semiconductor device and the semiconductor device are formed in a silicon semiconductor body at a distance of less than 50 μm.

A first breakdown voltage Vbr1 of a current path through the semiconductor device may be set larger than, equal to or smaller than a second breakdown voltage Vbr2 of a current path through the auxiliary semiconductor device.

According to the embodiments described above the semiconductor device includes pn junction between a first layer of a first conductivity type buried below a surface of a semiconductor body and a doped semiconductor region of a second conductivity type disposed between the surface and the first layer.

According to other embodiments, the semiconductor device may include another pn junction, e.g. the semiconductor device may be a lateral avalanche-based ESD structure, a trench diode including a first layer of a first conductivity type lining sidewalls or filling a trench that is at least partly surrounded by a semiconductor material of a complementary conductivity type, a bipolar junction (BJT) ESD structure, a grounded gate (gg) n-type metal oxide field effect transistor (NMOS), a vertical diode including cathode and anode electrodes at opposite sides of a semiconductor body, a silicon controlled rectifier (SCR) or thyristor, an insulated gate bipolar transistor (IGBT), a high electron mobility transistor (HEMT), a gate shorted (gs) p-type metal oxide field effect transistor (PMOS), and a Schottky diode.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
an auxiliary semiconductor device configured to emit radiation; and
a semiconductor device, wherein:
an electrical coupling and an optical coupling between the auxiliary semiconductor device and the semiconductor device is configured to trigger emission of radiation by the auxiliary semiconductor device and to trigger avalanche breakdown in the semiconductor device by absorption of the radiation in the semiconductor device; and
the semiconductor device includes a pn junction between a first layer of a first conductivity type buried below and spaced apart from a surface of a semiconductor body and a doped semiconductor region of a second conductivity type disposed between the surface and the first layer, and wherein the avalanche breakdown is triggered at the pn junction.

2. The semiconductor component of claim 1, further comprising a contact structure electrically coupling the first layer and a wiring above the surface.

3. The semiconductor component of claim 2, wherein the contact structure includes at least one of a sinker contact, a trench contact, a mesa contact and a metal contact.

4. The semiconductor component of claim 1, wherein the auxiliary semiconductor device is a Zener diode surrounded by the doped semiconductor region of the second conductivity type, the Zener diode including a first semiconductor region of the second conductivity type buried below the surface and a second semiconductor region of the first conductivity type disposed between the first semiconductor region and the surface.

5. The semiconductor component of claim 1, further comprising a device isolation structure between the semiconductor device and the auxiliary semiconductor device, and wherein the auxiliary semiconductor device is a Zener diode.

6. The semiconductor component of claim 1, further comprising a device isolation structure between the semiconductor device and the auxiliary semiconductor device, and wherein the auxiliary semiconductor device is a diode operating in forward bias during operation of the semiconductor component.

7. The semiconductor component of claim 1, wherein the doped semiconductor region is a p-well in an n-doped semiconductor layer, the semiconductor component further comprising a trench isolation structure extending from the surface through the first layer into a p-doped semiconductor substrate.

8. The semiconductor component of claim 1, further comprising a parallel connection of the semiconductor device and the auxiliary semiconductor device.

9. The semiconductor component of claim 8, wherein a first breakdown voltage Vbr1 of a current path through the semiconductor device is larger than a second breakdown voltage Vbr2 of a current path through the auxiliary semiconductor device.

10. The semiconductor component of claim 8, wherein a first breakdown voltage Vbr1 of a current path through the semiconductor device is equal to or smaller than a second breakdown voltage Vbr2 of a current path through the auxiliary semiconductor device.

11. The semiconductor component of claim 1, further comprising a series element electrically connected in series to the auxiliary semiconductor device.

12. The semiconductor component of claim 11, wherein the series element includes at least one of a capacitor, a diode, a stack of diodes, a current limiting element including one or more of a resistor, a junction field effect transistor, a depletion mode field effect transistor.

13. The semiconductor component of claim 1, wherein the auxiliary semiconductor device is one or a combination of a Zener diode including a cathode electrically coupled to a component pin having a specified positive maximum voltage rating, and a diode including an anode electrically coupled to a component pin having a specified positive maximum voltage rating.

14. The semiconductor component of claim 1, wherein the semiconductor device is an ESD diode including one of a single pn junction diode and a stack of anti-serial pn junction diodes.

* * * * *